US012777872B2

(12) United States Patent
Hsiao et al.

(10) Patent No.: US 12,777,872 B2
(45) Date of Patent: Oct. 27, 2026

(54) METHOD AND STRUCTURE FOR SEMICONDUCTOR INTERCONNECT

(71) Applicant: Taiwan Semiconductor Manufacturing Co., Ltd., Hsin-Chu (TW)

(72) Inventors: Ru-Shang Hsiao, Hsinchu County (TW); Chun Hsiung Tsai, Hsinchu County (TW); Clement Hsingjen Wann, Carmel, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/635,270

(22) Filed: Apr. 15, 2024

(65) Prior Publication Data

US 2024/0258096 A1 Aug. 1, 2024

Related U.S. Application Data

(60) Continuation of application No. 17/582,648, filed on Jan. 24, 2022, now Pat. No. 11,961,731, which is a (Continued)

(51) Int. Cl.
*H10P 70/00* (2026.01)
*B08B 3/08* (2006.01)

(Continued)

(52) U.S. Cl.
CPC .............. *H10P 70/277* (2026.01); *B08B 3/08* (2013.01); *H10P 50/283* (2026.01);

(Continued)

(58) Field of Classification Search
CPC ........... H01L 21/3111; H01L 21/76805; H01L 21/76843; H01L 21/76889; H01L 23/535; H10D 84/0149
See application file for complete search history.

(56) References Cited

U.S. PATENT DOCUMENTS 6,140,233 A 10/2000 Kwag
6,376,368 B1 4/2002 Jung (Continued)

FOREIGN PATENT DOCUMENTS

CN 105006467 A 10/2015
EP 1039530 A2 9/2000

(Continued)

OTHER PUBLICATIONS

Yoon, KR 100591162, A Method for Cleaning Contact Holes of a semiconductor Device, Jun. 19, 2006 (Year: 2006).*

*Primary Examiner* — Alexander G Ghyka
(74) *Attorney, Agent, or Firm* — HAYNES AND BOONE, LLP

(57) ABSTRACT

A semiconductor structure includes a substrate, a conductive feature over the substrate, a dielectric layer over the conductive feature and the substrate, and a structure disposed over and electrically connected to the conductive feature. The structure is partially surrounded by the dielectric layer and includes a first metal-containing layer and a second metal-contain layer surrounded by the first metal-containing layer. The first and the second metal-containing layers include different materials. A lower portion of the first metal-containing layer includes a transition metal or a transition metal nitride and an upper portion of the first metal-containing layer includes a transition metal fluoride or a transition metal chloride.

20 Claims, 12 Drawing Sheets

Related U.S. Application Data division of application No. 16/735,137, filed on Jan. 6, 2020, now Pat. No. 11,232,943.

(60) Provisional application No. 62/837,860, filed on Apr. 24, 2019.

(51) Int. Cl.
*H10P 50/28* (2026.01)
*H10W 20/00* (2026.01)
*H10W 20/20* (2026.01)

(52) U.S. Cl.
CPC ....... *H10W 20/033* (2026.01); *H10W 20/056* (2026.01); *H10W 20/062* (2026.01); *H10W 20/066* (2026.01); *H10W 20/0698* (2026.01); *H10W 20/083* (2026.01); *H10W 20/20* (2026.01)

(56) References Cited

U.S. PATENT DOCUMENTS

| | | | | |
|---|---|---|---|---|
| 6,506,689 | B2 | 1/2003 | Rolfson | |
| 8,772,109 | B2 | 7/2014 | Colinge | |
| 8,785,285 | B2 | 7/2014 | Tsai | |
| 8,816,444 | B2 | 8/2014 | Wann | |
| 8,823,065 | B2 | 9/2014 | Wang | |
| 8,860,148 | B2 | 10/2014 | Hu | |
| 9,105,490 | B2 | 8/2015 | Wang | |
| 9,236,267 | B2 | 1/2016 | De | |
| 9,236,300 | B2 | 1/2016 | Liaw | |
| 9,299,803 | B2 | 3/2016 | Tsai | |
| 9,337,316 | B2 | 5/2016 | Tsai | |
| 9,490,317 | B1 * | 11/2016 | Labonte | H10D 30/60 |
| 9,520,482 | B1 | 12/2016 | Chang | |
| 9,576,814 | B2 | 2/2017 | Wu | |
| 9,892,930 | B1 | 2/2018 | Sawa | |
| 2001/0009814 | A1 | 7/2001 | Rolfson | |
| 2004/0127027 | A1 | 7/2004 | Lee | |
| 2006/0234516 | A1 | 10/2006 | Hong | |
| 2010/0244252 | A1 | 9/2010 | Jezewski | |
| 2015/0072511 | A1 | 3/2015 | Liu | |
| 2017/0358531 | A1 | 12/2017 | Lin | |
| 2018/0138075 | A1 | 5/2018 | Kang | |
| 2023/0386821 | A1 | 11/2023 | Wang | |
| 2023/0386917 | A1 | 11/2023 | Chen | |

FOREIGN PATENT DOCUMENTS

| | | | |
|---|---|---|---|
| JP | H05206061 | A | 8/1993 |
| JP | H11312682 | A | 11/1999 |
| KR | 20000071404 | A | 11/2000 |
| KR | 100591162 | B1 | 6/2006 |
| KR | 20060072824 | A | 6/2006 |
| KR | 20150030135 | A | 3/2015 |
| KR | 20180068846 | A | 6/2018 |

* cited by examiner

METHOD AND STRUCTURE FOR SEMICONDUCTOR INTERCONNECT

PRIORITY

This is a continuation application of U.S. patent application Ser. No. 17/582,648 filed Jan. 24, 2022, which is a divisional application of U.S. patent application Ser. No. 16/735,137 filed Jan. 6, 2020, which claims the benefits of U.S. Provisional Patent Application No. 62/837,860, filed Apr. 24, 2019, the disclosure of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when forming interconnect structures (including contacts, vias, wires, etc.) in an IC, metal elements may diffuse and/or migrate from its intended places. This may happen as a result of etching processes, chemical mechanical planarization (CMP) processes, or other processes that are performed to a metal layer. Those diffused metal elements may cause short circuit between closely placed conductive features, such as between a source/drain contact and a nearby gate contact or between two adjacent metal wires. Methods that can eliminate those metal diffusions are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
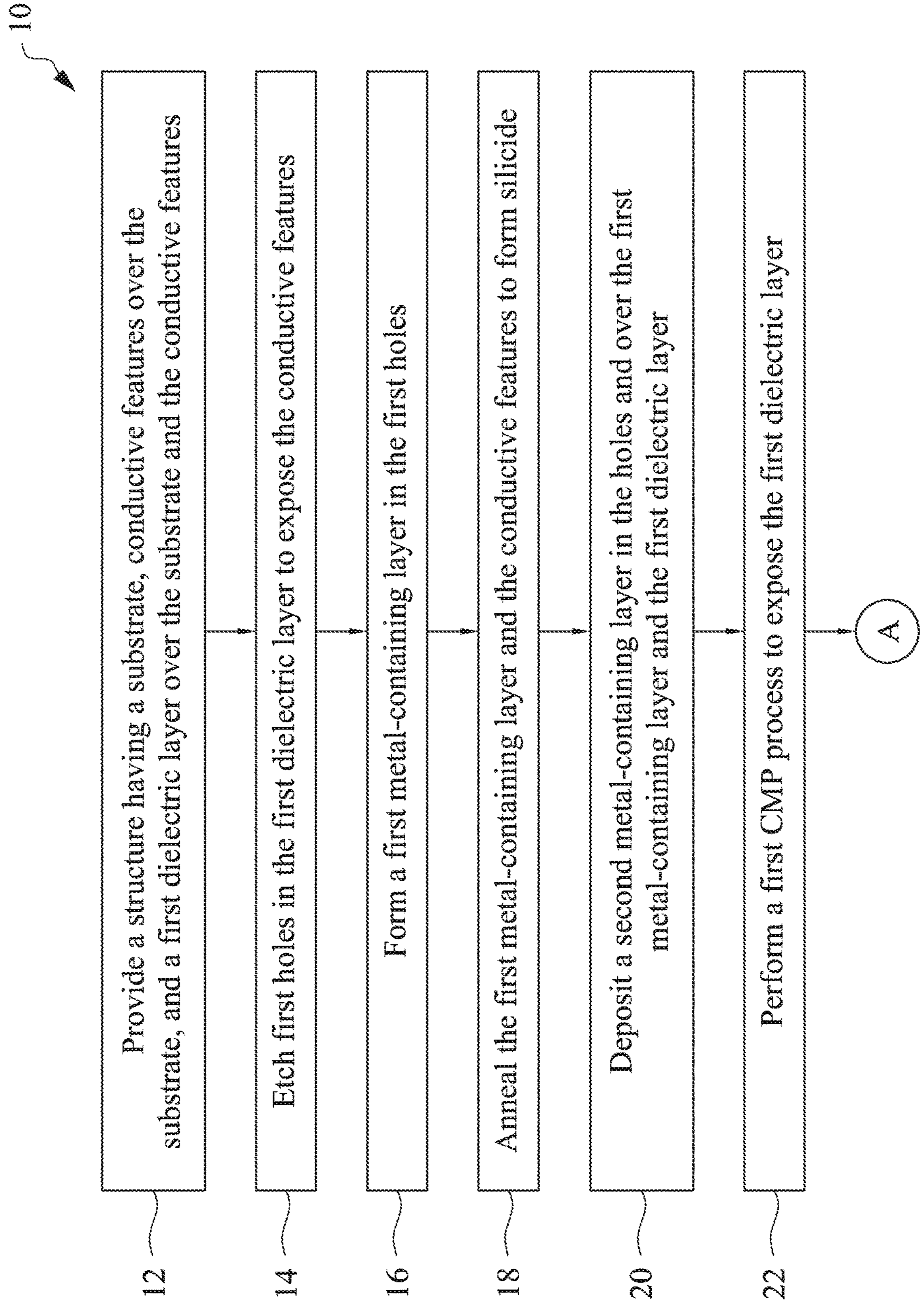
FIGS. 1A, 1B, and 1C show a flow chart of a method of forming interconnect structures and/or features in a semiconductor device, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating an interconnect structure in a semiconductor device. The interconnect structure may include a first conductive feature embedded in or surrounded by one or more dielectric layers and a second conductive feature disposed over and electrically connected to the first conductive feature. The first and the second conductive features may include source/drain electrodes, gate electrodes, source/drain contacts (or contact plugs), source/drain contact vias (or via plugs), gate vias, other vias, metal wires, and other conductive elements. The interconnect structure may be fabricated by etching a hole in the dielectric layers to expose the first conductive feature, depositing one or more metal materials in the hole, and removing excessive metal materials by an etching or CMP process. During the etching or CMP process, metal residues may diffuse or migrate, which might cause short circuit or other manufacturing defects if not properly treated. An object of the present disclosure is to treat such metal residues with some chemical(s) to produce stable metal compounds.

Specifically, embodiments of the present disclosure may deposit a metal or a metal nitride as part of the conductive features in the IC interconnect, and further apply a chemical containing fluorine or chlorine to convert residues of the metal or the metal nitride into metal fluorides or metal chlorides. The metal fluorides and the metal chlorides are stable (for example, they do not react with oxygen in the surrounding dielectric layers). Accordingly, manufacturing defects due to diffused metal elements are prevented. Some embodiments of the present disclosure use a two-step cleaning and etching process after a CMP process. The first step applies a first chemical with a relatively low concentration for recessing a dielectric layer, and the second step applies a second chemical with a relatively high concentration for reacting with metals. The two steps collectively remove metal residues and produce stable metal compounds. Aspects of the present disclosure are further discussed by reference to the FIGS. 1A-1C, 2A-2I, and 3A-3H.

Figure 1B:
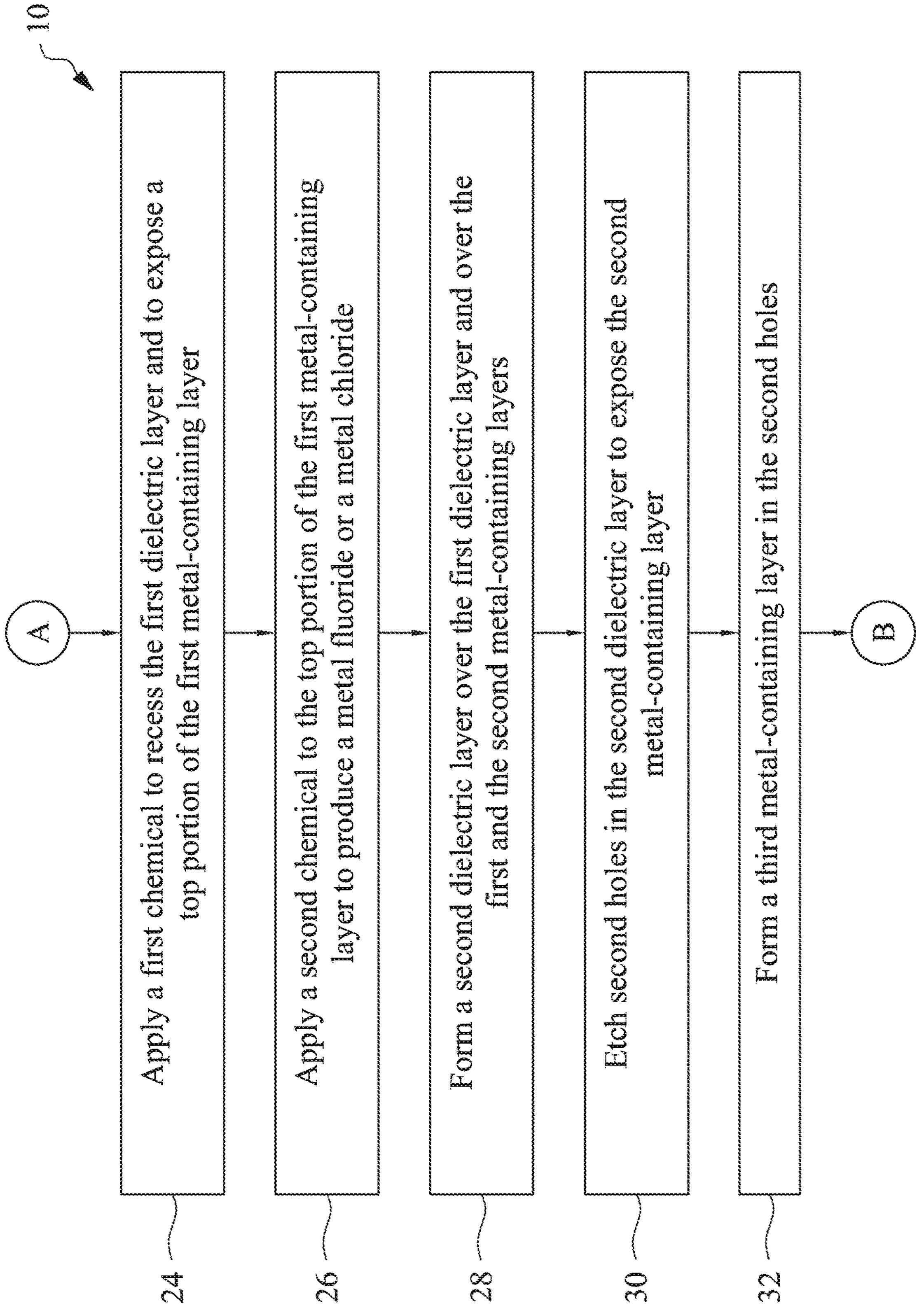
Figure 1C:
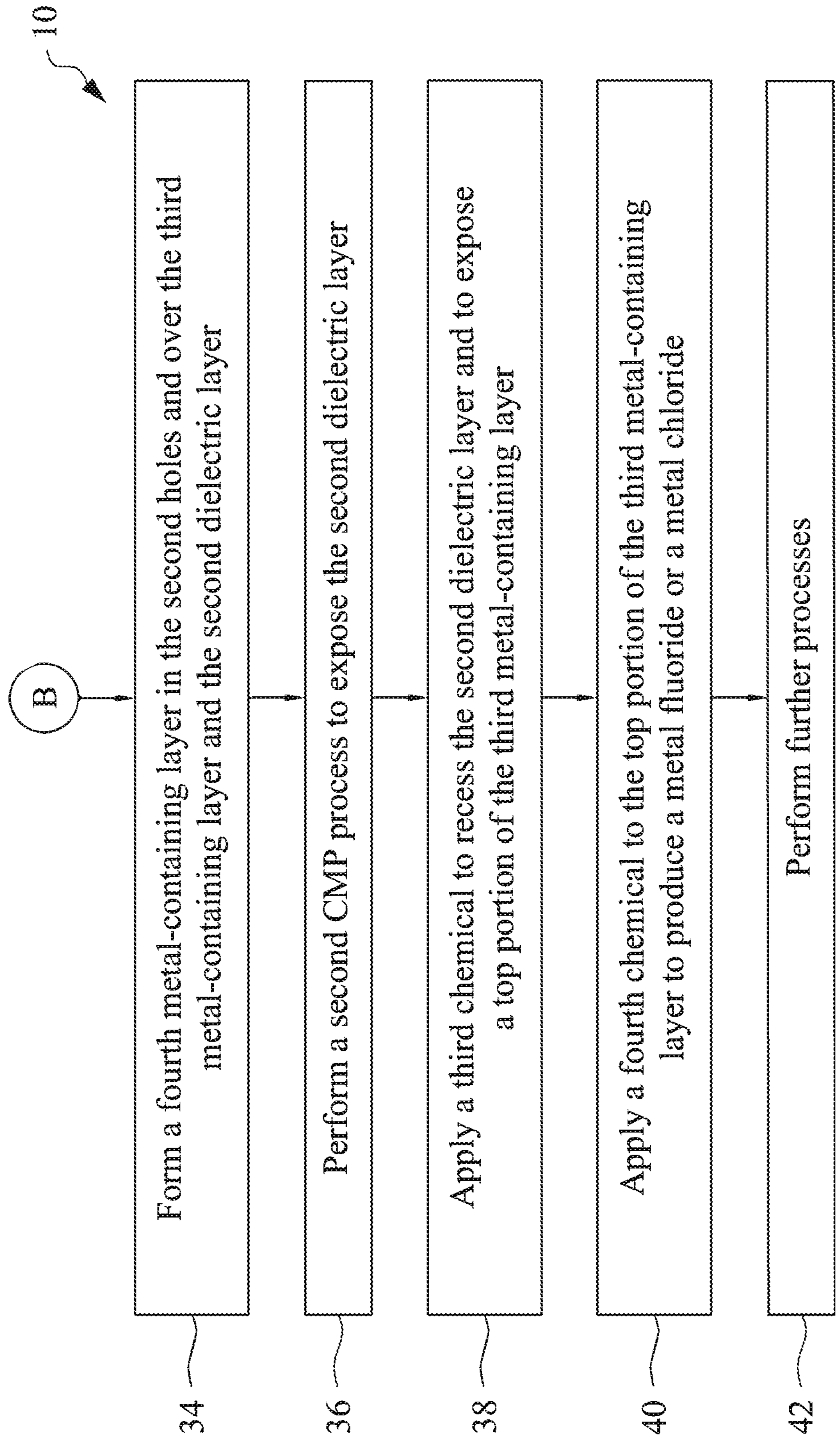

FIGS. 1A-1C illustrate a flow chart of a method 10 for forming a semiconductor device 100 (also referred to as device structure 100 or structure 100) in accordance with an embodiment. The method 10 is merely an example and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-3H, which illustrate various cross-sectional views and top views of the semiconductor device 100 during fabrication steps according to the method 10. Furthermore, the semiconductor device 100 may be an intermediate device fabricated during processing of an integrated circuit (IC), or a portion thereof, that may comprise static random access memory (SRAM), other memory cells, and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, FinFETs, gate-all-around (GAA) nanowire transistors, GAA nanosheet transistors, other multi-gate transistors, bipolar transistors, high voltage transistors, high frequency transistors, and combinations thereof.

Figure 2A:
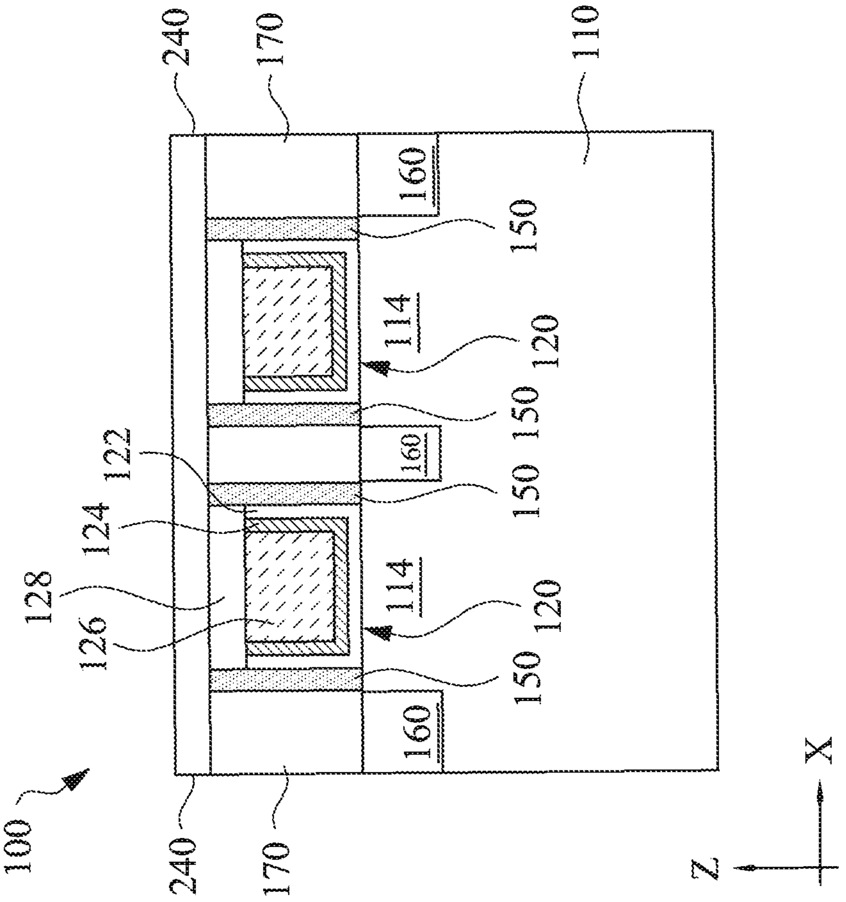
FIGS. 2A, 2B, 2C, 2D, 2E, 2F, 2G, 2H, 3A, 3B, 3C, 3D, 3E, 3F, and 3G illustrate cross-sectional views of a semiconductor structure during a fabrication process according to the method of FIGS. 1A-1C, in accordance with an embodiment.

Referring to FIG. 1A, at operation 12, the method 10 provides or is provided with a device structure 100 that includes a substrate and various features and layers over the substrate. An example of the device structure 100 is shown in FIG. 2A. Referring to FIG. 2A, the structure 100 includes a substrate 110 and various components built in or on the substrate 110, including transistor channels 114, gate structures 120 over the transistor channels 114, gate spacers 150 on sidewalls of the gate structures 120, source/drain features 160 on both sides of the transistor channels 114 and adjacent to the gate spacers 150, and dielectric layers 170 and 240. The dielectric layer 170 is disposed over the source/drain features 160 and between the gate spacers 150. The dielectric layer 240 is disposed over the dielectric layer 170, the gate structure 120, and the gate spacers 150. The device structure 100 may include other components (such as a contact etch stop layer over the source/drain features 160) that are not shown in FIG. 2A. The various components of the structure 100 are further described below.

The substrate 110 is a silicon substrate such as a silicon wafer in the present embodiment. Alternatively, the substrate 110 may comprise another semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The transistor channels 114 and the source/drain features 160 may be formed in or on active regions (not labeled) of the structure 100. The active regions may have a planar shape (for planar MOSFETs), a three-dimensional shape such as fins (for FinFETs) or vertically stacked multiple semiconductor layers (for GAA FETs), or other suitable shapes. The transistor channels 114 may include silicon, germanium, silicon germanium, or other suitable semiconductor materials; and may be doped or undoped. The source/drain features 160 may include lightly doped source/drain (LDD) features, highly doped source/drain (HDD) features, or other doped structures. The source/drain features 160 may include n-type doped silicon for NFET devices, p-type doped silicon germanium for PFET devices, or other doped semiconductor materials. Further, the source/drain features 160 may include epitaxially grown semiconductor materials or be otherwise raised or stressed for performance enhancement. Particularly, the source/drain features 160 are conductive.

The gate structure 120 may include a polysilicon gate, a high-k metal gate, or another suitable gate structure, which generally includes a gate conductor over a gate dielectric layer. The example shown in FIG. 2A includes a high-k metal gate structure. As shown, the gate structure 120 includes a high-k dielectric layer 122, a work function metal layer 124, a metal fill layer 126, and a capping layer (or hard mask layer) 128. The gate structure 120 may include other layers (such as an interfacial layer and/or a barrier layer) not shown in FIG. 2A in some embodiments. The high-k dielectric layer 122 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 122 may be formed using atomic layer deposition (ALD), chemical vapor deposition (CVD), physical vapor deposition (PVD), or other deposition techniques. The work function metal layer 124 may include a p-type or an n-type work function layer depending on the type (PFET or NFET) of the device. The p-type work function layer may include titanium nitride (TiN), tantalum nitride (TaN), ruthenium (Ru), molybdenum (Mo), tungsten (W), platinum (Pt), other suitable metals, or combinations thereof. The n-type work function layer may include titanium (Ti), aluminum (Al), tantalum carbide (TaC), tantalum carbide nitride (TaCN), tantalum silicon nitride (TaSiN), titanium silicon nitride (TiSiN), other suitable metals, or combinations thereof. The work function metal layer 124 may be formed by ALD, CVD, PVD, or other techniques. The metal fill layer 126 may include aluminum (Al), tungsten (W), cobalt (Co), and/or other suitable materials; and may be formed by ALD, CVD, PVD, plating, or other techniques. The capping layer 128 may include silicon nitride or other suitable dielectric material(s); and may be formed by CVD, PVD, ALD, or other techniques.

The gate spacers 150 may include a dielectric material, such as silicon oxide, silicon nitride, silicon oxynitride, silicon carbide, other dielectric material, or combinations thereof, and may include one or more layers of material. The gate spacers 150 may be formed by CVD, PVD, ALD, or other techniques.

The dielectric layer 170 may include silicon oxide, silicon oxynitride, tetraethylorthosilicate (TEOS) oxide, un-doped silicate glass, or doped silicon oxide such as borophosphosilicate glass (BPSG), fluorosilicate glass (FSG), phosphosilicate glass (PSG), other low-k dielectric materials, and/or other suitable dielectric materials. The dielectric layer 170 may be formed by plasma enhanced CVD (PECVD), flowable CVD (FCVD), or other suitable methods. The dielectric layer 170 may be referred to as ILD-0 layer, where ILD stands for interlayer dielectric layer.

The dielectric layer 240 may be referred to as ILD-1 layer as it is deposited over the ILD-0 layer 170. The dielectric layers 170 and 240 may include same or similar material(s).

For example, the dielectric layer 240 may include silicon oxide, silicon oxynitride, TEOS oxide, un-doped silicate glass, or doped silicon oxide such as BPSG, FSG, PSG, other low-k dielectric materials, and/or other suitable dielectric materials. The dielectric layer 240 may be formed by PECVD, FCVD, or other suitable methods. The device structure 100 may include a contact etch stop layer (CESL) between the dielectric layer 240 and the structures thereunder. The CESL may comprise silicon nitride, silicon oxynitride, silicon nitride with oxygen (O) or carbon (C) elements, and/or other materials; and may be formed by CVD, PVD, ALD, or other suitable methods.

Figure 2C:
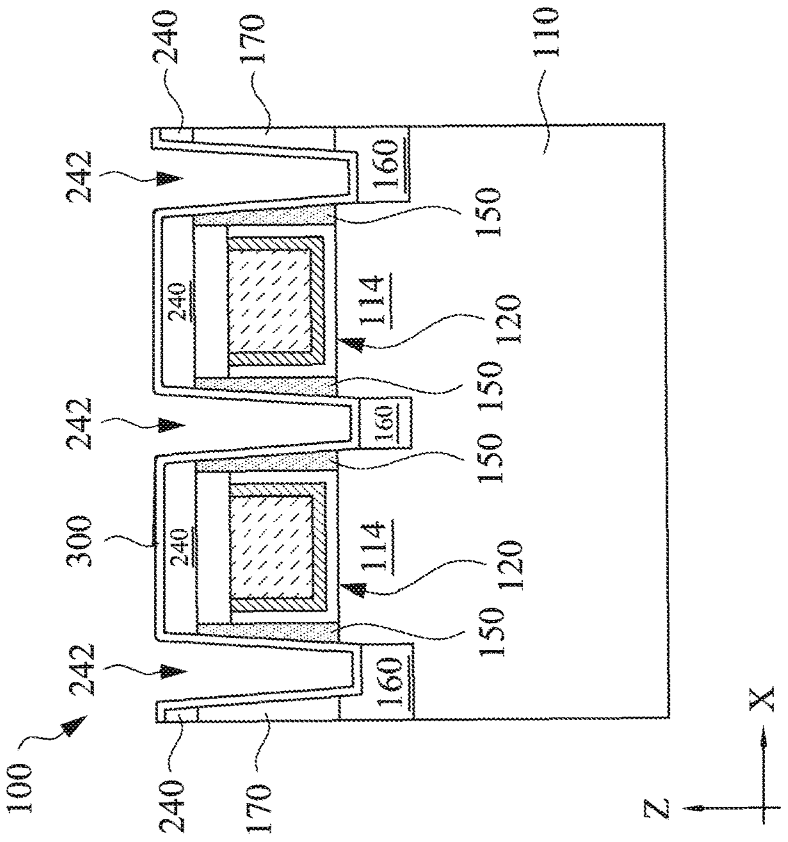
Figure 2B:
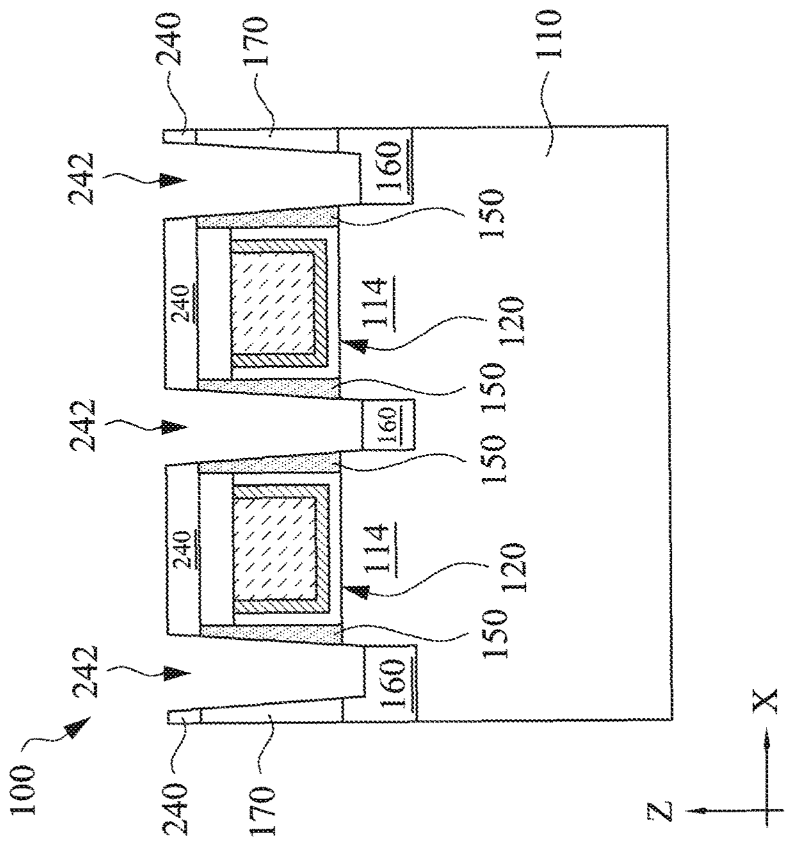

At operation 14, the method 10 (FIG. 1A) etches holes 242 in the dielectric layers 240 and 170 to expose the source/drain features 160. In some embodiments, the holes 242 have an oval shape, a circle shape, a rectangular shape, and/or a rounded rectangular shape with respect to a top view. The resultant structure 100 is shown in FIG. 2B. In an embodiment, the operation 14 includes a photolithography process and one or more etching processes. For example, the photolithography process may include depositing one or more hard mask layers over the structure 100, coating a photoresist layer over the hard mask layers, patterning the photoresist layer to form a resist etch mask, etching the hard mask layers and the dielectric layers 240 and 170 through the resist etch mask, and subsequently removing the resist etch mask and the hard mask layers. The etching processes can include dry etching, wet etching, reactive ion etching (RIE), and/or other suitable process that is designed to etch the materials in the dielectric layers 240 and 170. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (HF); potassium hydroxide (KOH) solution; ammonia; a solution containing hydrofluoric acid (HF), nitric acid ($HNO_3$), and/or acetic acid ($CH_3COOH$); or other suitable wet etchant. A top portion of the source/drain features 160 may also be etched by the operation 14. The holes 242 are sometimes referred to as source/drain contact holes.

At operation 16, the method 10 (FIG. 1A) forms a metal-containing layer 300 in the holes 242. The resultant structure 100 is shown in FIG. 2C. Referring to FIG. 2C, the metal-containing layer 300 is formed at least on sidewalls of the holes 242. In the present embodiment, the metal-containing layer 300 is also formed on the bottom surface of the holes 242 as well as on the top surface of the dielectric layer 240. The metal-containing layer 300 may be formed using CVD, PVD, ALD, or other suitable techniques, and may be formed to have a substantially uniform thickness (i.e., conformal) in some embodiments or non-uniform thickness in alternative embodiments. The metal-containing layer 300 may include a metal layer, a metal nitride layer, or a combination thereof. In an embodiment, the metal-containing layer 300 includes a transition metal, a transition metal nitride, or a combination thereof. For example, the metal-containing layer 300 may include titanium (Ti), titanium nitride (TiN), or a combination thereof. In some embodiments, the metal-containing layer 300 may include one of cobalt (Co), nickel (Ni), niobium (Nb), ruthenium (Ru), rhodium (Rh), tungsten (W), and rhenium (Re), or a nitride of one of these metals.

Figure 2D:
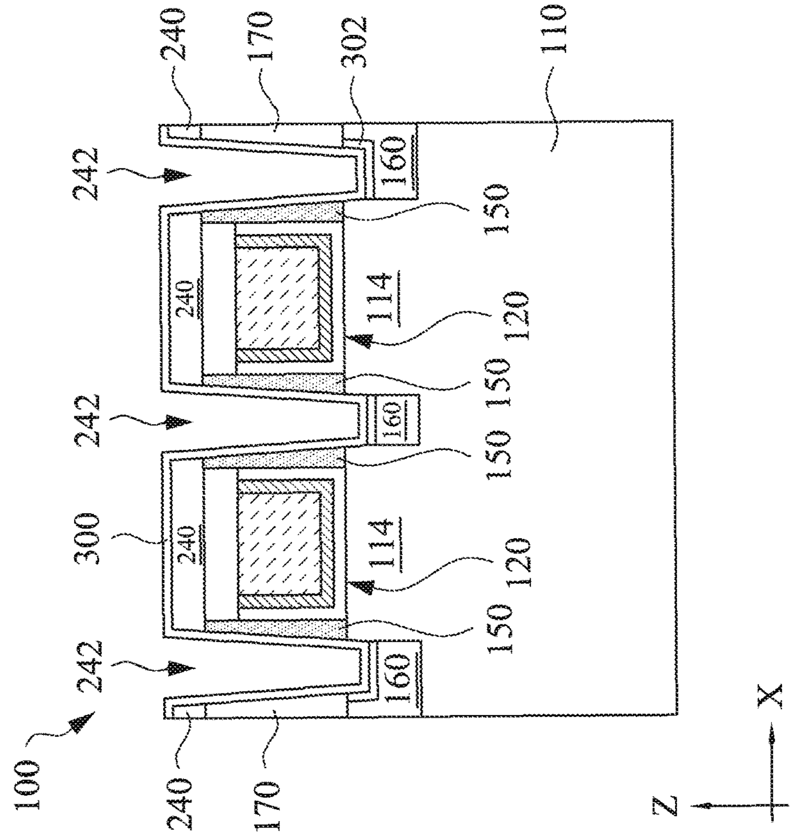

At operation 18, the method 10 (FIG. 1A) anneals the structure 100 to form silicide 302 over the source/drain features 160. The resultant structure 100 is shown in FIG. 2D. For example, the operation 18 may be performed at a suitable temperature for suitable duration to cause reaction between the metal-containing layer 300 and the semiconductor materials in the source/drain features 160, thereby forming the silicide 302. For example, when the metal-containing layer 300 includes titanium, the operation 18 may include a rapid thermal annealing (RTA) at about 700° C. to 800° C. for 1 second to 240 seconds to form TiSi and/or $TiSi_2$. The portion of the metal-containing layer 300 at the bottom surface of the holes 242 may be fully or partially converted to the silicide 302 in various embodiments. The operation 18 may use RTA, milli-second annealing (MSA), or other annealing techniques.

Figure 2E:
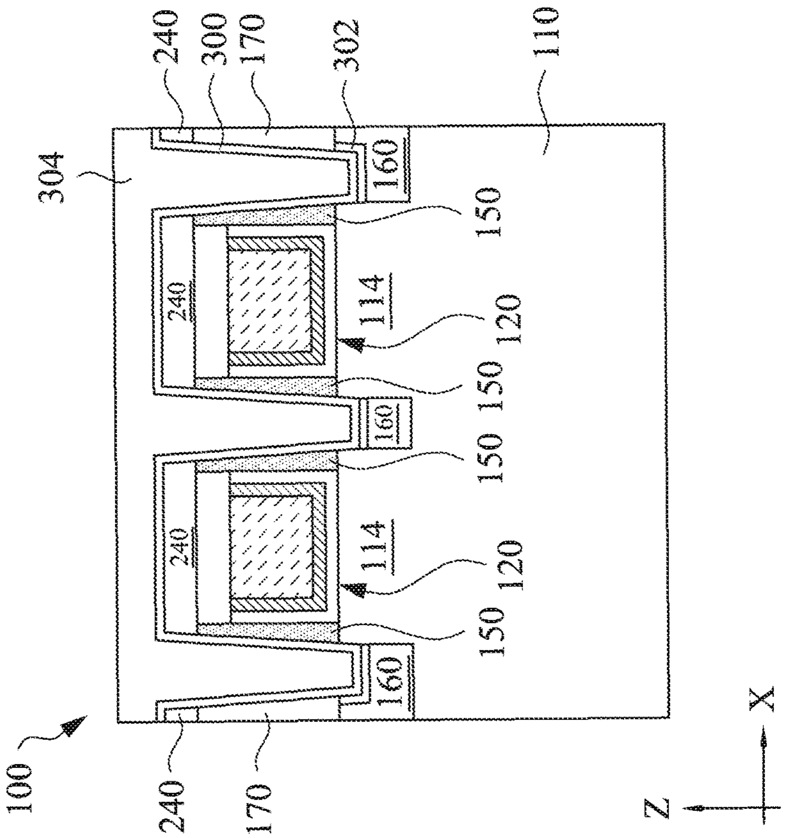

At operation 20, the method 10 (FIG. 1A) deposits another metal-containing layer 304 to fill in remaining space of the holes 242. Referring to FIG. 2E, the metal-containing layer 304 is deposited over the silicide 302 and over the metal-containing layer 300. In the present embodiment, the metal-containing layer 304 is also deposited over the portion of the metal-containing layer 300 on the dielectric layer 240. The metal-containing layer 304 may include W, Co, Ru, other metals, metal nitrides such as TiN, titanium aluminum nitride (TiAlN), tungsten nitride (WN), tantalum nitride (TaN), or combinations thereof. The metal-containing layers 304 may be formed by CVD, PVD, plating, and/or other suitable processes.

Figure 2G:
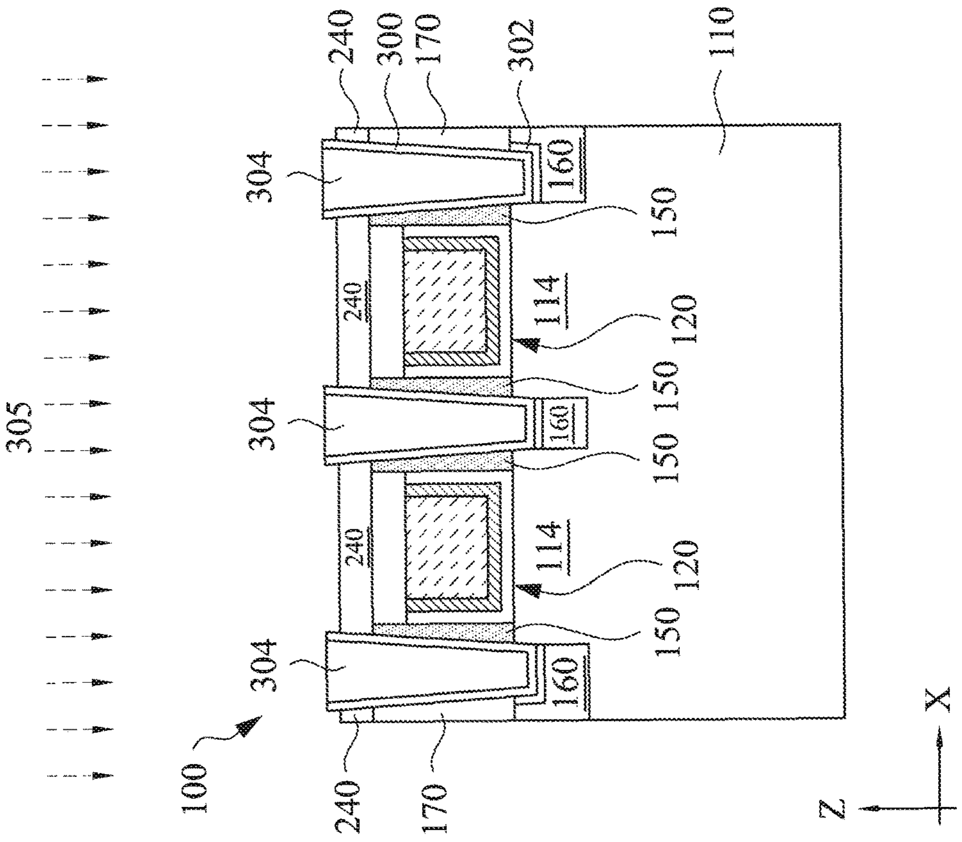
Figure 2F:
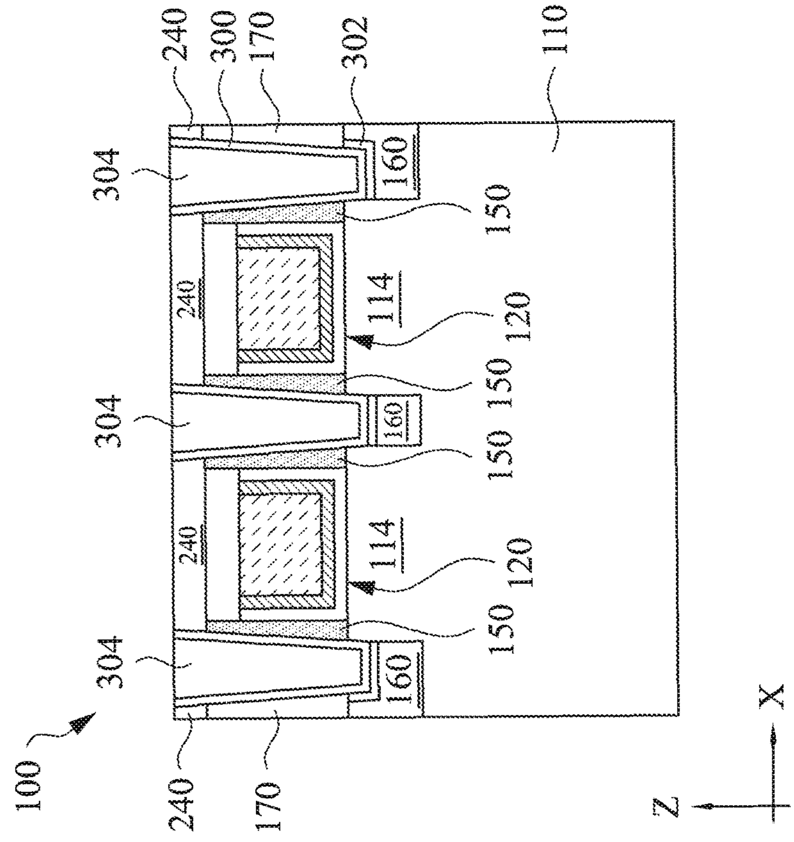

At operation 22, the method 10 (FIG. 1A) performs a CMP process to partially remove (or thin down) the metal-containing layer 304 and to expose the dielectric layer 240. The dielectric layer 240 may be partially removed by the CMP process as well. The resultant structure 100 is shown in FIG. 2F. At this fabrication stage, the top surface of the structure 100 is substantially planar. However, some metal residuals (or particles) may appear on the top surface of the dielectric layer 240. Further, some metal residuals from the metal-containing layer 300 may appear on the top surface of the metal-containing layer 304. Since these metal residues may contain transition metal(s) that are very reactive with oxygen, if not removed, they might react with oxygen elements in the dielectric layer 240 or other dielectric layers deposited on top of the layers 240 and 304 to cause manufacturing defects.

At operation 24, the method 10 (FIG. 1B) applies a first chemical 305 to recess the dielectric layer 240. As a result, a top portion of the metal-containing layer 300 and a top portion of the metal-containing layer 304 extend above the dielectric layer 240, as shown in FIG. 2G. In an embodiment, the chemical 305 includes dilute hydrofluoric (HF) acid at a low concentration. For example, the dilute HF acid may have a concentration of hydrogen fluoride (HF) in deionized (DI) water about 0.1% or lower. The dilute HF acid at such concentration is able to recess the dielectric layer 240 (which is primarily silicon dioxide in an example) but does not react well with the metal-containing layers 300 and 304. In another embodiment, the chemical 305 includes dilute hydrochloric (HCl) acid (or chlorane) at a low concentration. For example, the dilute HCl acid may have a concentration of hydrogen chloride (HCl) in DI water about 0.1% or lower. The operation 24 may also remove some of the metal residues on top of the dielectric layer 240 in some embodiments. The dielectric layer 240 may be recessed by a few nanometers, such as about 2 nm. The depth of the recess is determined by the concentration of the first chemical 305, the duration of the operation 24, and other factors.

For example, the operation 24 may apply a dilute HF acid having a concentration of 0.1% for about from 6 to 18 seconds to recess the dielectric layer 240 by about from 1 to 5 nm. In some embodiments, the depth of the recess is controlled to be less than 5 nm to avoid too much loss of the dielectric layer 240.

Figure 2I:
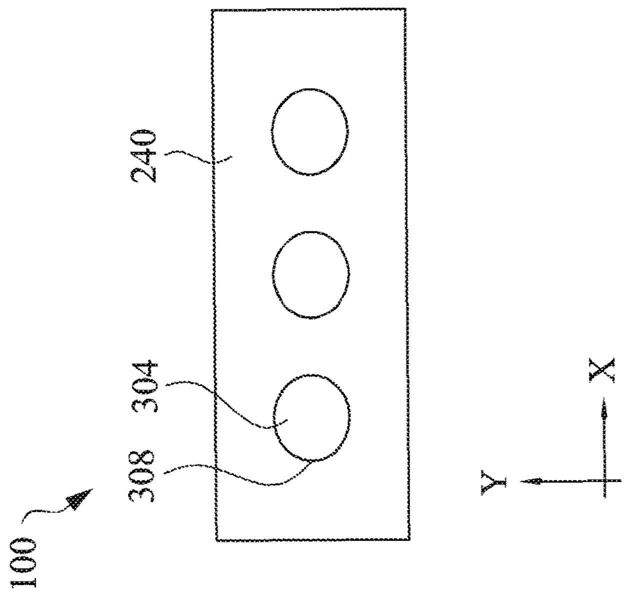
FIGS. 2I and 3H illustrates a top view of a semiconductor structure during a fabrication process according to the method of FIGS. 1A-1C, in accordance with an embodiment.
Figure 2H:
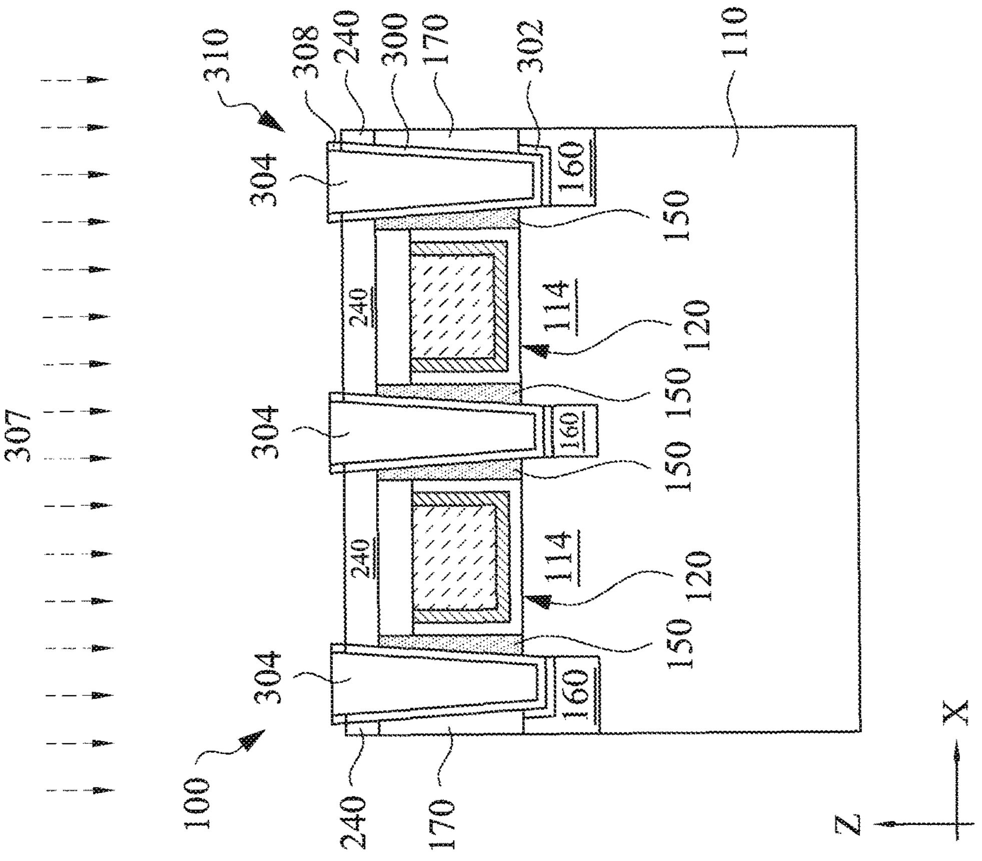
Figure 3B:
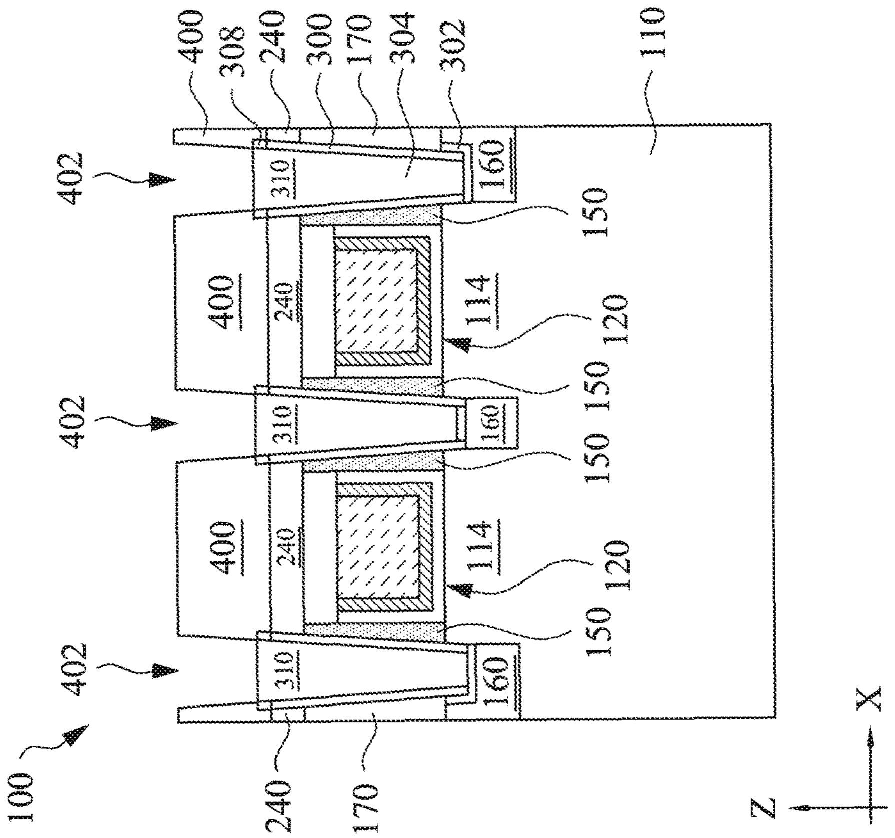

At operation 26, the method 10 (FIG. 1B) applies a second chemical 307 to the exposed top portion of the metal-containing layer 300 and converts it into a metal compound 308. The resultant structure 100 is shown in FIGS. 2H and 2I. The second chemical 307 is designed to effectively convert the exposed top portion of the metal-containing layer 300 into a stable metal compound 308 while not significantly recessing the dielectric layer 240. In the present embodiment, the second chemical 307 includes a fluorine or chlorine component and the metal compound 308 includes a metal fluoride or a metal chloride, respectively. In embodiments where metal residues exist on the top surface of the dielectric layer 240, the second chemical 307 also converts those metal residues into stable metal compounds such as metal fluoride or metal chloride. The chemical 307 may also react with the metal-containing layer 304 to produce some metal compounds on the top surface of the metal-containing layer 304. Those metal compounds will be removed in subsequent processes (e.g., when etching via holes over the metal-containing layer 304 as shown in FIG. 3B).

In an embodiment, the second chemical 307 has the same constituents as the first chemical 305 but with a higher chemical concentration. The lower concentration in the chemical 305 is designed such that the chemical 305 can recess the dielectric layer 240 (e.g., having primarily silicon dioxide) but does not react well with the metal-containing layer 300 (e.g., having a transition metal or a transition metal nitride). The higher concentration in the chemical 307 is designed to react well with the metal-containing layer 300.

For example, both the chemicals 305 and 307 may be dilute HF acid but the chemical 307 has a higher concentration of HF in DI water than the chemical 305. For example, the concentration of HF in DI water for the chemical 307 may be at least 10 times higher than that for the chemical 305. In at least one example, the concentration of HF in DI water for the chemical 307 is about 1% or more while the concentration of HF in DI water for the chemical 305 is about 0.1% or less. A dilute HF acid with a concentration of 1% or more reacts well with the metal-containing layer 300. However, it also etches the dielectric layer 240. To avoid too much loss of the dielectric layer 240, the concentration of HF in DI water for the chemical 307 is designed to be about 1% to 2% in some embodiments. In these examples, the metal compound 308 includes a metal fluoride. For example, when the metal-containing layer 300 includes titanium, the metal compound 308 includes titanium fluoride (e.g., $TiF_3$).

For another example, both the chemicals 305 and 307 may be dilute HCl acid but the chemical 307 has a higher concentration of HCl in DI water than the chemical 305. For example, the concentration of HCl in DI water for the chemical 307 may be at least 10 times higher than that for the chemical 305. In at least one example, the concentration of HCl in DI water for the chemical 307 is about 1% or more (such as about 1% to 2%) while the concentration of HCl in DI water for the chemical 305 is about 0.1% or less. In these examples, the metal compound 308 includes a metal chloride. For example, when the metal-containing layer 300 includes titanium, the metal compound 308 includes titanium chloride (e.g., $TiCl_3$).

In another embodiment, the two chemicals 305 and 307 have different constituents where the chemical 305 is designed to have higher etch selectivity (higher etch rate) on the dielectric layer 240 than on the metal-containing layer 300, while the chemical 307 is designed to have higher etch selectivity on the metal-containing layer 300 than on the dielectric layer 240. For example, the chemical 305 may be a dilute HF acid at a low concentration such as 0.1% or lower, and the chemical 307 may be a dilute HCl acid at a higher concentration such as 1% or higher (such as about 1% to 2%). In this example, the chemical 305 does not react well with the metal-containing layer 300 but still effectively etches the dielectric layer 240. At the same time, the chemical 307 reacts well with the metal-containing layer 300 although it also slightly etches the dielectric layer 240. In this example, the metal compound 308 includes a metal chloride. For example, when the metal-containing layer 300 includes titanium, the metal compound 308 includes titanium chloride (e.g., $TiCl_3$).

FIG. 2I illustrates a partial, top view of the device 100 at this fabrication stage. As shown, the metal compound 308 surrounds the metal-containing layer 304. Both the metal compound 308 and the metal-containing layer 304 have a generally rounded shape in this example. However, they may have other shapes such as a generally rectangular shape or an irregular shape in various embodiments. The metal compound 308 is chemically very stable and does not react with oxygen. The top surface of the dielectric layer 240 is substantially free of any reactive metal elements such as transition metals or transition metal nitrides. Accordingly, by performing the operations 24 and 26 post the CMP process in operation 22, the method 10 effectively removes any reactive metal elements from the top surface of the dielectric layer 240, thereby preventing metal diffusion defects discussed above. Further, the structure that includes the metal-containing layers 300 and 304 and the metal compound 308 becomes a source/drain contact (or contact plug) 310. As shown in FIG. 2H, a lower portion of the source/drain contact 310 includes a lower portion of the metal-containing layer 304 surrounded by the metal-containing layer 300, and an upper portion of the source/drain contact 310 includes an upper portion of the metal-containing layer 304 surrounded by the metal compound 308. The upper portion of the source/drain contact 310 extends above the top surface of the dielectric layer 240. The source/drain contact 310 is disposed directly on the silicide 302 that is disposed over the source/drain feature 160.

The method 10 may continue building the interconnect structure on the device 100. For example, the method 10 may create via structures that are disposed over the source/drain contacts 310 by performing operations 28 through 40 shown in FIGS. 1B and 1C. Many aspects of the operations 28 through 40 are similar to the operations 12 through 26 discussed above. Thus, the operations 28 through 40 are briefly discussed below in conjunction with FIGS. 3A through 3H.

Figure 3A:
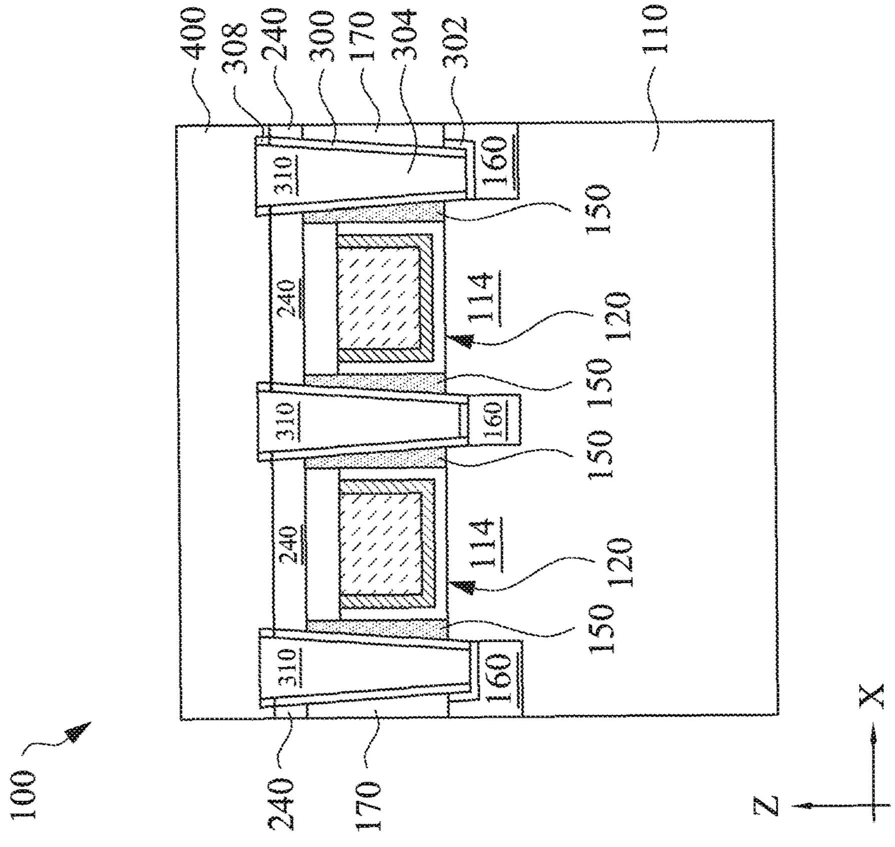

At operation 28, the method 10 (FIG. 1B) forms another dielectric layer 400 over the dielectric layer 240 and the source/drain contacts 310. The resultant structure 100 is shown in FIG. 3A. The dielectric layer 400 may include same or similar materials as the dielectric layer 240. In an embodiment, the dielectric layer 400 may include silicon oxide, silicon oxynitride, TEOS oxide, un-doped silicate glass, or doped silicon oxide such as BPSG, FSG, PSG, other low-k dielectric materials, and/or other suitable dielectric materials. The dielectric layer 400 may be formed by PECVD, FCVD, or other suitable methods. The device structure 100 may include a contact etch stop layer (CESL) between the dielectric layer 400 and the dielectric layer 240 and the source/drain contacts 310. The dielectric layer 400 may be referred to as ILD-2 layer in some embodiments.

At operation 30, the method 10 (FIG. 1B) etches via holes 402 in the dielectric layer 400 to expose some of the conductive features thereunder such as the source/drain contacts 310 and/or the gate structures 120. The resultant structure 100 is shown in FIG. 3B. Referring to FIG. 3B, the via holes 402 expose the source/drain contacts 310 for forming source/drain contact vias. Although not shown, some via holes 402 may be etched directly above the gate structures 120 for forming gate vias. The operation 30 is similar to the operation 14 discussed above. For example, the operation 30 may include a photolithography process to form an etch mask and an etching process to etch the dielectric layer 400 through the etch mask.

Figure 3C:
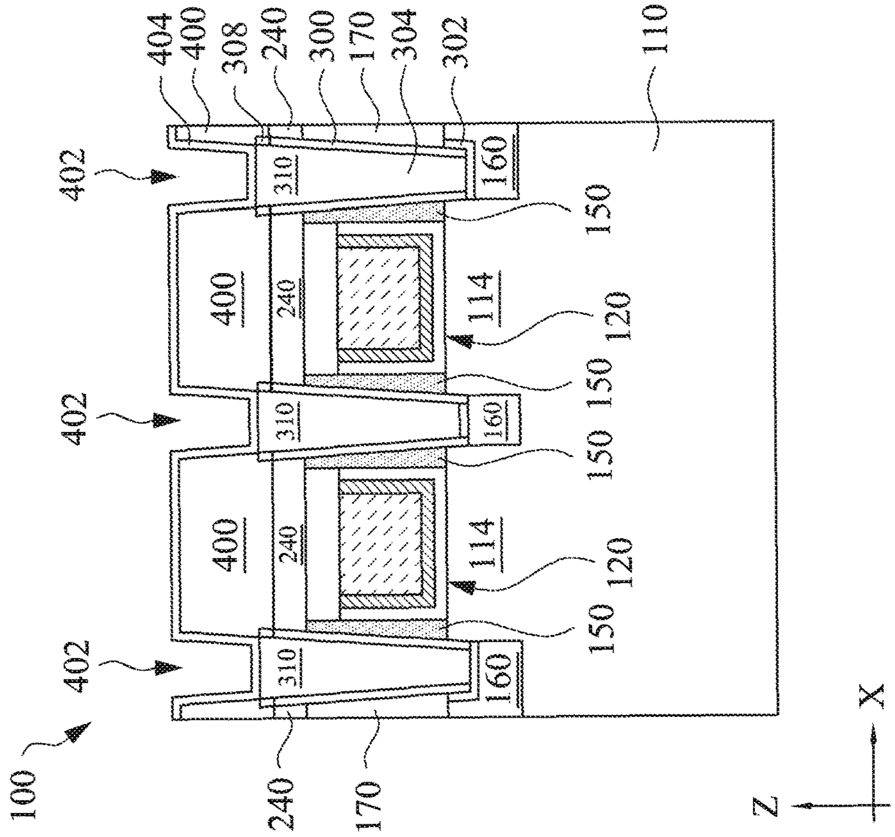

At operation 32, the method 10 (FIG. 1B) forms a metal-containing layer 404 in the via holes 402. The resultant structure 100 is shown in FIG. 3C. Referring to FIG. 3C, the metal-containing layer 404 is formed on the bottom surface and sidewalls of the via holes 402 as well as on the top surface of the dielectric layer 400. The metal-containing layer 404 may be formed using CVD, PVD, ALD, or other suitable techniques, and may be formed to have a substantially uniform thickness (i.e., conformal) in some embodiments or non-uniform thickness in alternative embodiments. The metal-containing layer 404 may include a metal layer, a metal nitride layer, or a combination thereof. In an embodiment, the metal-containing layer 404 includes a transition metal, a transition metal nitride, or a combination thereof. For example, the metal-containing layer 404 may include tantalum (Ta), tantalum nitride (TaN), or a combination thereof. Aspects of the operation 32 are similar to those of the operation 16.

Figure 3D:
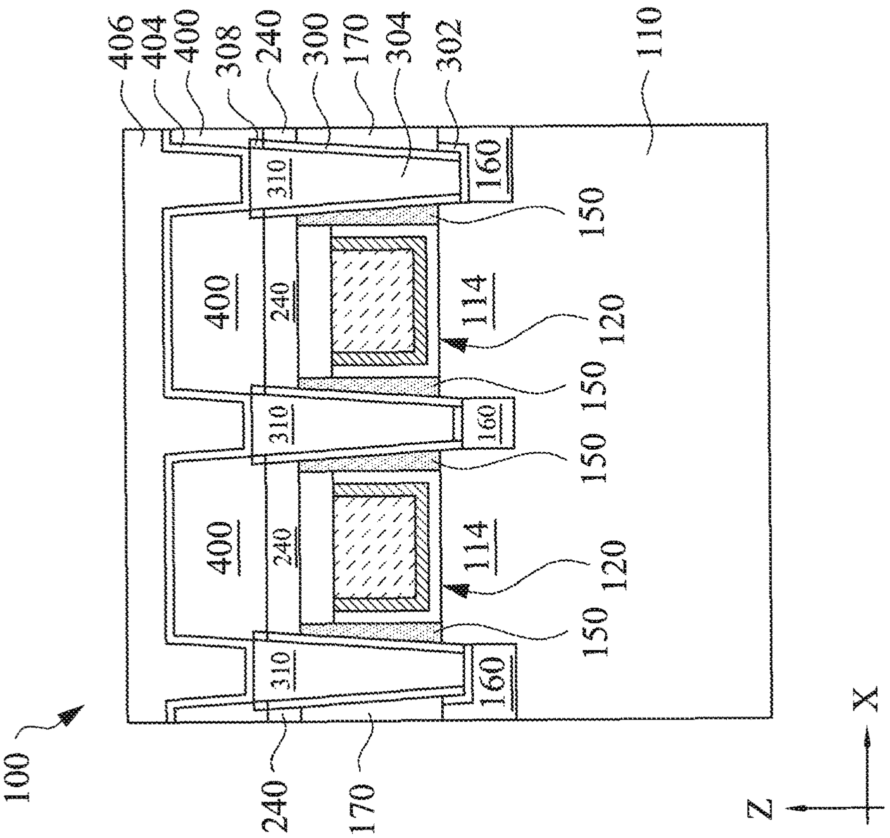

At operation 34, the method 10 (FIG. 1C) forms a metal-containing layer 406 to fill in remaining space of the via holes 402. Referring to FIG. 3D, the metal-containing layers 406 is deposited over the metal-containing layer 404. The metal-containing layers 406 may include copper or other metals such as W, Co, or Ru; and may be formed by CVD, PVD, plating, and/or other suitable processes. Aspects of the operation 34 are similar to those of the operation 20.

Figure 3F:
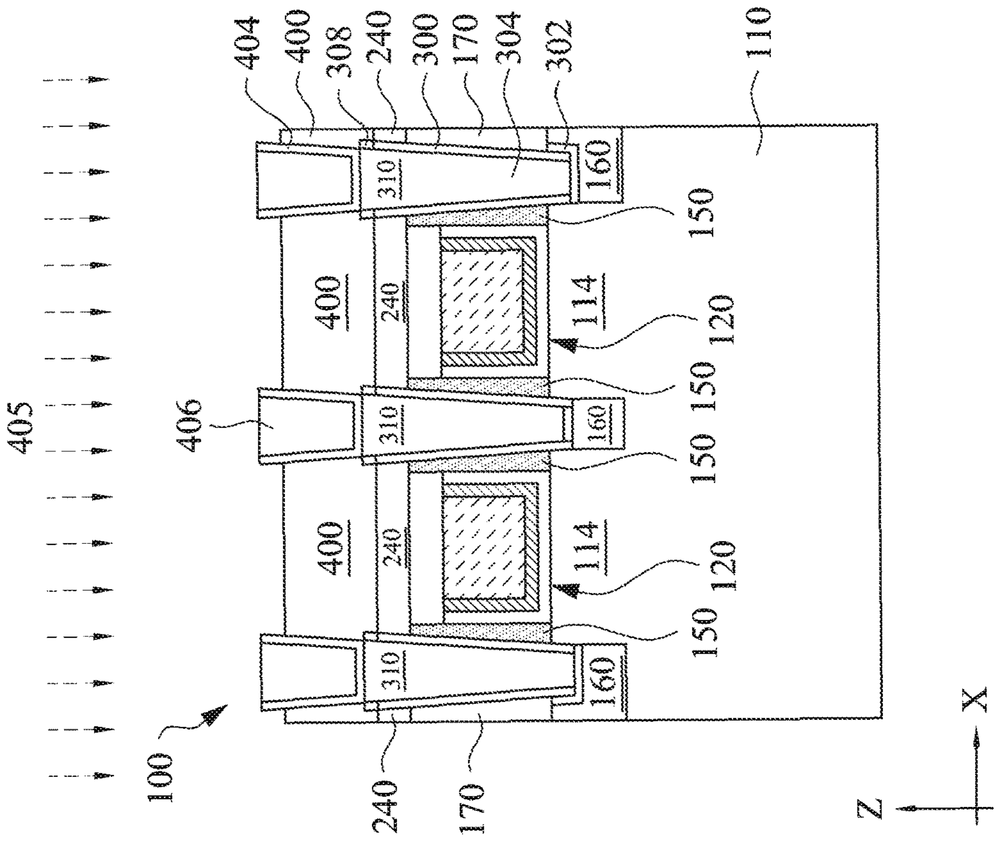
Figure 3E:
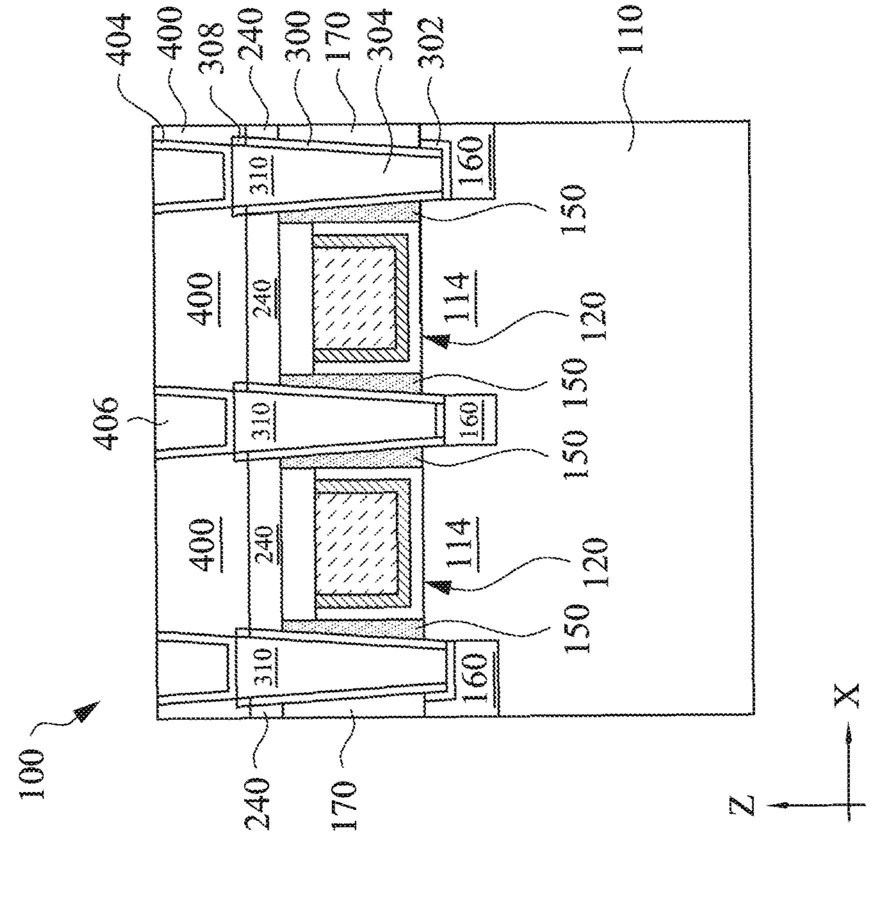

At operation 36, the method 10 (FIG. 1C) performs a CMP process to partially remove (or thin down) the metal-containing layer 406 and to expose the dielectric layer 400. The dielectric layer 400 may be partially removed by the CMP process as well. The resultant structure 100 is shown in FIG. 3E. Aspects of the operation 36 are similar to those of the operation 22. At this fabrication stage, the top surface of the structure 100 is substantially planar. However, some metal residuals (or particles) may appear on top of the dielectric layer 400. Since these metal residues may contain transition metal(s) that are very reactive with oxygen, if not removed, they might react with oxygen elements in the dielectric layer 400 or layers deposited on top of the layers 400 and 406 to cause manufacturing defects.

At operation 38, the method 10 (FIG. 1C) applies a third chemical 405 to recess the dielectric layer 400. As a result, a top portion of the metal-containing layer 404 and a top portion of the metal-containing layer 406 extend above the dielectric layer 400, as shown in FIG. 3F. Aspects of the operation 38 are similar to those of the operation 24. The chemical 405 may be designed to be the same as or similar to the chemical 305 discussed above. For example, the chemical 405 may include dilute HF acid or dilute HCl acid at a low concentration (such as about 0.1% or lower).

Figure 3H:
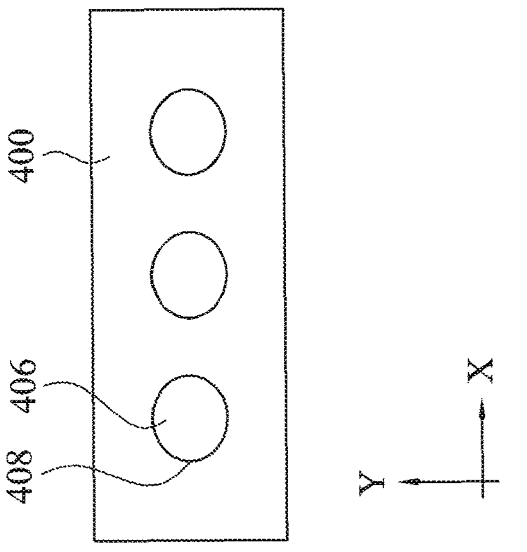
Figure 3G:
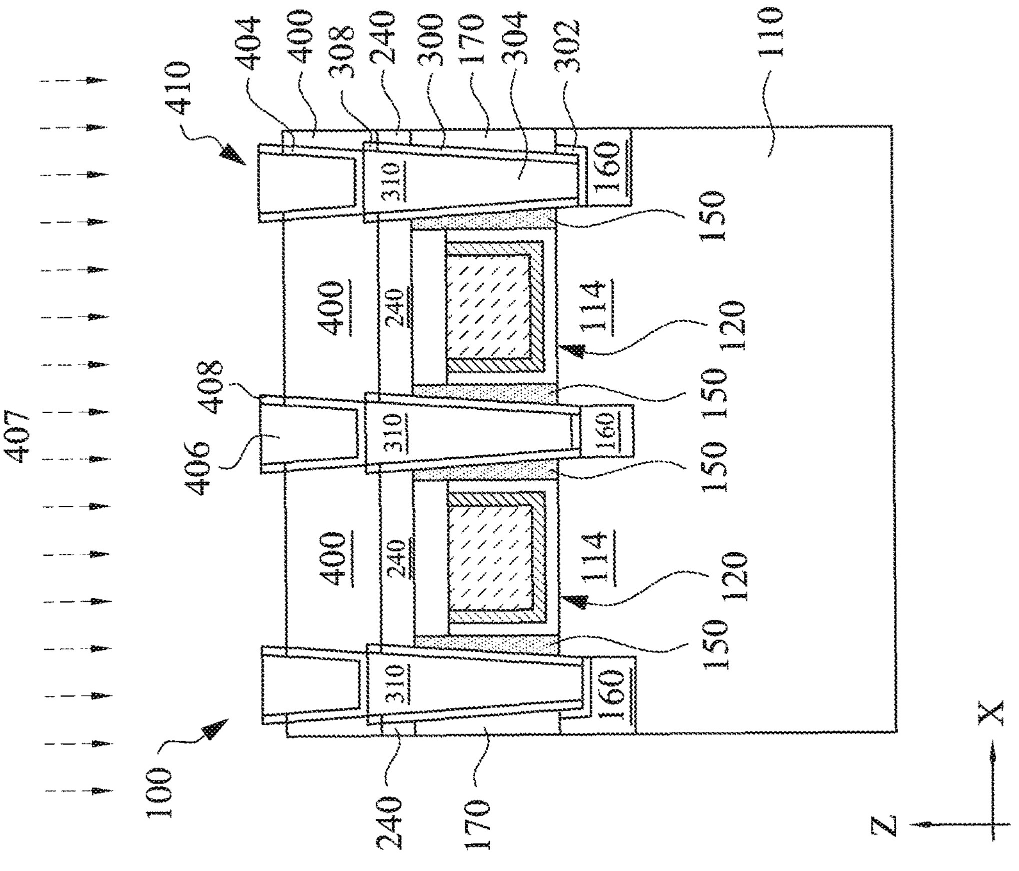

At operation 40, the method 10 (FIG. 1C) applies a fourth chemical 407 to the exposed top portion of the metal-containing layer 404 and converts it into a metal compound 408. The resultant structure 100 is shown in FIGS. 3G and 3H. Aspects of the operation 40 are similar to those of the operation 26. The chemical 407 may be designed to be the same as or similar to the chemical 307 discussed above. For example, the chemical 407 may include dilute HF acid or dilute HCl acid at a relatively high concentration (such as about 1% or higher or about 1% to 2%). The metal compound 408 may include a metal fluoride or a metal chloride. For example, when the metal-containing layer 404 includes tantalum, the metal compound 408 may include tantalum fluoride (e.g., $TaCl_3$) or tantalum chloride (e.g., $TaCl_3$).

In an embodiment, the chemical 405 may be a dilute HF acid at a low concentration such as 0.1% or lower, and the chemical 407 may be a dilute HCl acid at a higher concentration such as 1% or higher (such as about 1% to 2%). In this example, the chemical 405 does not react well with the metal-containing layer 404 but still effectively etches the dielectric layer 400. At the same time, the chemical 407 reacts well with the metal-containing layer 404 although it also slightly etches the dielectric layer 400. In this example, the metal compound 408 includes a metal chloride, such as tantalum chloride (e.g., $TaCl_3$).

FIG. 3H illustrates a partial, top view of the device 100 at this fabrication stage. As shown, the metal compound 408 surrounds the metal-containing layer 406. Both the metal compound 408 and the metal-containing layer 406 have a generally rounded shape in this example. However, they may have other shapes such as a generally rectangular shape or an irregular shape in various embodiments. The metal compound 408 is chemically very stable and does not react with oxygen. The top surface of the dielectric layer 400 is substantially free of any reactive metal elements such as transition metals or transition metal nitrides. Accordingly, by performing the operations 38 and 40 post the CMP process in operation 36, the method 10 effectively removes any reactive metal elements from the surface of the dielectric layer 400, thereby preventing metal diffusion defects discussed above. Further, the structure that includes the metal-containing layers 404 and 406 and the metal compound 408 becomes a source/drain contact via 410. As shown in FIG. 3G, a lower portion of the source/drain contact via 410 includes a lower portion of the metal-containing layer 406 surrounded by the metal-containing layer 404, and an upper portion of the source/drain contact via 410 includes an upper portion of the metal-containing layer 406 surrounded by the metal compound 408. The upper portion of the source/drain contact via 410 extends above the top surface of the dielectric layer 400. Although not shown, the device structure 100 may include gate vias disposed over and electrically connected to the gate structures 120 where the gate vias have a similar structure as the source/drain contact vias 410.

At operation 42, the method 10 (FIG. 1C) performs further processes to complete the fabrication of the device 100. For example, the method 10 may form wires connecting to the source/drain contact vias 410 and gate vias, and may repeat the above operations to form higher level interconnect structures.

Although not intended to be limiting, one or more embodiments of the present disclosure provide many benefits to a semiconductor device and the formation thereof. For example, embodiments of the present disclosure provide methods for removing metal residues from dielectric layers by a two-step cleaning (or etching) process. The cleaning process converts reactive metal residues into stable metal compounds to prevent metal diffusion manufacturing defects. Further, embodiments of the present disclosure can be readily integrated into existing semiconductor manufacturing processes.

In one aspect, the present disclosure is directed to a method. The method includes receiving a structure having a substrate, a conductive feature over the substrate, and a dielectric layer over the conductive feature and the substrate. The method further includes forming a hole in the dielectric layer, the hole exposing the conductive feature; forming a first metal-containing layer on at least sidewalls of the hole; forming a second metal-containing layer in the hole and surrounded by the first metal-containing layer, wherein the first and the second metal-containing layers include different materials; applying a first chemical to recess the dielectric layer, resulting in a top portion of the first metal-containing layer and a top portion of the second metal-containing layer protruding above the dielectric layer; and applying a second chemical having fluorine or chlorine to the top portion of the first metal-containing layer to convert the top portion of the first metal-containing layer into a metal fluoride or a metal chloride.

In some embodiments, the first chemical includes a dilute hydrofluoric (HF) acid and the second chemical includes a dilute hydrochloric (HCl) acid. In a further embodiment, the dilute hydrofluoric acid has a concentration of HF in deionized water about 0.1% or less, and the dilute hydrochloric acid has a concentration of HCl in deionized water about 1% or more.

In an embodiment, the first metal-containing layer includes a transition metal, a transition metal nitride, or a combination thereof. In a further embodiment, the transition metal or the transition metal nitride includes one of Ti, Co, Ni, Nb, Ru, Rh, W, and Re.

In another embodiment, the forming of the second metal-containing layer includes depositing the second metal-containing layer over the dielectric layer. The method further includes applying a chemical mechanical planarization (CMP) process to the second metal-containing layer to expose the dielectric layer.

In an embodiment of the method, the first chemical includes a dilute hydrofluoric (HF) acid having a first concentration of HF in deionized water about 0.1% or less, and the second chemical includes another dilute HF acid having a second concentration of HF in deionized water and the second concentration is at least 10 times higher than the first concentration. In a further embodiment, the second concentration is about 1% to 2%.

In an embodiment, the dielectric layer includes silicon oxide. In an embodiment where the conductive feature includes a doped semiconductor, the method further includes, after the forming of the first metal-containing layer, annealing the first metal-containing layer and the conductive feature to result in a metal silicide between the first metal-containing layer and the conductive feature.

In another aspect, the present disclosure is directed to a method. The method includes receiving a structure having a substrate, a conductive feature over the substrate, and a dielectric layer over the conductive feature and the substrate, the dielectric layer having silicon oxide. The method further includes etching a hole in the dielectric layer, the hole exposing the conductive feature; depositing a first metal-containing layer on bottom and sidewalls of the hole, the first metal-containing layer having a transition metal or a transition metal nitride; depositing a second metal-containing layer in the hole, over the first metal-containing layer, and over the dielectric layer, wherein the first and the second metal-containing layers include different materials; performing a chemical mechanical planarization (CMP) process to the second metal-containing layer to expose the dielectric layer; applying a first chemical to recess the dielectric layer, resulting in a top portion of the first metal-containing layer and a top portion of the second metal-containing layer protruding above the dielectric layer; and applying a second chemical having fluorine or chlorine to the top portion of the first metal-containing layer to convert the top portion of the first metal-containing layer into a transition metal fluoride or a transition metal chloride.

In an embodiment of the method, the first chemical includes a dilute hydrofluoric (HF) acid and the second chemical includes a dilute hydrochloric (HCl) acid. In a further embodiment, the dilute HF acid has a concentration of HF in deionized water of 0.1% or lower, and the dilute HCl acid has a concentration of HCl in deionized water of 1% to 2%.

In another embodiment of the method, the first chemical includes a dilute hydrofluoric (HF) acid having a first concentration of HF in deionized water about 0.1% or lower, and the second chemical includes another dilute HF acid having a second concentration of HF in deionized water about 1% to 2%. Yet another embodiment, the first metal-containing layer includes one of Ti, TiN, Ta, and TaN.

In yet another aspect, the present disclosure is directed to a semiconductor structure. The semiconductor structure includes a substrate, a conductive feature over the substrate; a dielectric layer over the conductive feature and the substrate; and a structure disposed over the conductive feature and at least partially surrounded by the dielectric layer. The structure includes a first metal-containing layer and a second metal-contain layer surrounded by the first metal-containing layer. The first and the second metal-containing layers include different materials. A lower portion of the first metal-containing layer includes a transition metal or a transition metal nitride and an upper portion of the first metal-containing layer includes a transition metal fluoride or a transition metal chloride.

In an embodiment of the semiconductor structure, the lower portion of the first metal-containing layer includes titanium or titanium nitride, and the upper portion of the first metal-containing layer includes titanium fluoride or titanium chloride. In another embodiment of the semiconductor structure, the lower portion of the first metal-containing layer includes tantalum or tantalum nitride, and the upper portion of the first metal-containing layer includes tantalum fluoride or tantalum chloride.

In an embodiment, the first metal-containing layer includes Ti or Ta, and the second metal-containing layer includes W, Co, Ru, or Cu. In an embodiment, the semiconductor structure further includes a metal silicide between the conductive feature and the first metal-containing layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a gate structure over a substrate;

a first dielectric layer over the gate structure;

a second dielectric layer over the first dielectric layer; and a source/drain contact disposed adjacent to the gate structure, extending through the first dielectric layer, and comprising:

a metal fill layer;

a first conductive liner extending along a lower portion of a sidewall surface of the metal fill layer; and a second conductive liner extending along an upper portion of the sidewall surface of the metal fill layer, wherein the first conductive liner and the second conductive liner have different compositions, and wherein a topmost surface of the second conducive liner is coplanar with a top surface of the metal fill layer, above a top surface of the first dielectric layer, and below a top surface of the second dielectric layer.

2. The semiconductor structure of claim 1, wherein the first conductive liner comprises a metal layer or a metal nitride layer.

3. The semiconductor structure of claim 1, wherein the second conductive liner comprises a metal compound having a metal element same as a metal element of the metal fill layer.

4. The semiconductor structure of claim 3, wherein the second conductive liner comprises a metal fluoride or a metal chloride.

5. The semiconductor structure of claim 1, further comprising:

a source/drain feature disposed under the source/drain contact.

6. A semiconductor structure, comprising:

a gate structure over a substrate;

a first dielectric layer over the gate structure;

a source/drain contact adjacent to gate structure and extending through the first dielectric layer, wherein the source/drain contact comprises an inner portion and a liner extending along a sidewall of the inner portion; and a second dielectric layer extending over the first dielectric layer, wherein a top surface of the source/drain contact is above a top surface of the first dielectric layer and below a top surface of the second dielectric layer, wherein the liner comprises an upper portion and a lower portion, and the upper portion and the lower portion have different compositions.

7. The semiconductor structure of claim 6, further comprising:

a source/drain feature; and a silicide layer on the source/drain feature, wherein the source/drain contact is electrically coupled to the source/drain feature by way of the silicide layer.

8. The semiconductor structure of claim 6, further comprising:

a capping layer disposed between the first dielectric layer and the gate structure.

9. The semiconductor structure of claim 6, wherein the upper portion comprises a metal fluoride or a metal chloride.

10. The semiconductor structure of claim 9, wherein the upper portion is more chemically stable than the lower portion.

11. A semiconductor structure, comprising:

a gate structure over a substrate;

a first dielectric layer over the gate structure;

a second dielectric layer extending over the first dielectric layer;

a source/drain contact disposed adjacent to the gate structure and extending through the first dielectric layer, wherein a top portion of the source/drain contact protrudes from a top surface of the first dielectric layer and extends into the second dielectric layer; and a conductive liner comprising an upper portion over the first dielectric layer and extending along a sidewall surface of the top portion of the source/drain contact and a lower portion in the first dielectric layer and extending along a sidewall surface of a bottom portion of the source/drain contact, wherein the upper portion and the lower portion of the conductive liner comprise different compositions, and the upper portion of the conductive liner comprises a transition metal fluoride or a transition metal chloride.

12. The semiconductor structure of claim 11, wherein the lower portion of the conductive liner is disposed directly under the upper portion of the conductive liner.

13. The semiconductor structure of claim 11, wherein the further comprising:

a conductive feature on the source/drain contact and partially embedded in the second dielectric layer, wherein a top surface of the conductive feature is above a top surface of the second dielectric layer.

14. The semiconductor structure of claim 13, further comprising:

a transition metal fluoride layer or a transition metal chloride layer over the second dielectric layer, on a sidewall surface of the conductive feature, and having a top surface coplanar with a top surface of the conductive feature.

15. The semiconductor structure of claim 5, further comprising:

a silicide layer disposed between the source/drain feature and the metal fill layer.

16. The semiconductor structure of claim 1, further comprising:

a via disposed on the source/drain contact, wherein the via comprises a conductive layer and a third conductive liner extending along a bottom surface and a sidewall surface of the conductive layer.

17. The semiconductor structure of claim 16, wherein the third conductive liner comprises:

a first portion extending along the bottom surface of the conductive layer and a lower portion of the sidewall surface of the conductive layer; and a second portion extending along an upper portion of the sidewall surface of the conductive layer, wherein the first portion and the second portion have different compositions.

18. The semiconductor structure of claim 17, further comprising:

wherein a top surface of the via is above a top surface of the second dielectric layer.

19. The semiconductor structure of claim 7, wherein the upper portion is disposed over the first dielectric layer and embedded in the second dielectric layer.

20. The semiconductor structure of claim 1, wherein the second conductive liner comprises titanium fluoride or titanium chloride.

* * * * *